United States Patent
Hutchinson et al.

(10) Patent No.: US 11,650,230 B2
(45) Date of Patent: May 16, 2023

(54) MAGNETIC SENSOR WITH AUTOMATIC BALANCE CIRCUITRY

(71) Applicant: Baker Hughes Holdings LLC, Houston, TX (US)

(72) Inventors: Andrew Walter Hutchinson, Richmond, VA (US); James Michael Lustig, Newbury, OH (US)

(73) Assignee: Baker Hughes Holdings LLC, Houston, TX (US)

( * ) Notice: Subject to any disclaimer, the term of this patent is extended or adjusted under 35 U.S.C. 154(b) by 0 days.

(21) Appl. No.: 17/585,764

(22) Filed: Jan. 27, 2022

(65) Prior Publication Data

US 2022/0244297 A1    Aug. 4, 2022

Related U.S. Application Data

(60) Provisional application No. 63/143,979, filed on Feb. 1, 2021.

(51) Int. Cl.
*G01R 15/20* (2006.01)
(52) U.S. Cl.
CPC .................................. *G01R 15/207* (2013.01)
(58) Field of Classification Search
CPC ............................. G01R 15/207; G01R 35/00
See application file for complete search history.

(56) References Cited

U.S. PATENT DOCUMENTS

| 3,815,011 A | * | 6/1974 | Milkovic | G01R 15/18 324/123 R |
|---|---|---|---|---|
| 6,566,856 B2 | | 5/2003 | Sandquist et al. | |
| 7,365,535 B2 | | 4/2008 | Muniraju et al. | |
| 7,796,028 B1 | | 9/2010 | Kotter et al. | |
| 2013/0106412 A1 | * | 5/2013 | Nomura | G01R 33/00 324/252 |
| 2019/0339306 A1 | * | 11/2019 | Ichinohe | G01R 15/205 |

* cited by examiner

*Primary Examiner* — Dominic E Hawkins
(74) *Attorney, Agent, or Firm* — Mintz Levin Cohn Ferris Glovsky and Popeo, PC

(57) ABSTRACT

Sensor circuitry utilizing feedback to balance sensor output data is provided. An apparatus can include a primary coil and a first secondary coil outputting a first voltage. The apparatus can also include a second secondary coil outputting a second voltage. The apparatus can further include circuitry coupled to the first secondary coil and the second secondary coil. The circuitry can be configured to receive the first voltage from the first secondary coil and the second voltage from the second secondary coil. The circuitry can also be configured to determine a feedback voltage based on a difference between the first voltage and the second voltage. The feedback voltage can correct the difference. The circuitry can also modify a third voltage that can be output by the circuitry to be zero based on the feedback voltage.

19 Claims, 4 Drawing Sheets

MAGNETIC SENSOR WITH AUTOMATIC BALANCE CIRCUITRY

CROSS-REFERENCE TO RELATED APPLICATIONS

This application claims the benefit of and priority to U.S. Provisional Patent Application Ser. No. 63/143,979, filed on Feb. 1, 2021 and entitled "MAGNETIC SENSOR WITH AUTOMATIC BALANCE CIRCUITRY," the entirety of which is incorporated by reference.

BACKGROUND

Sensors, such as magnetic sensors, can be coupled to industrial equipment to monitor an operating characteristic of the industrial equipment. Magnetic Sensors can include electrical circuits configured to convey signal data associated with the operating characteristic being sensed by the sensor. Circuits and/or components of magnetic sensors can also convey signal data associated with operation of the sensor, such as null voltage values under balanced conditions. Detecting and correcting non-null voltage values in sensors can be an important requirement to improve signal amplification and sensor sensitivity.

SUMMARY

In one aspect an apparatus is provided. In an embodiment, the apparatus can include a primary coil and a first secondary coil outputting a first voltage. The apparatus can also include a second secondary coil outputting a second voltage. The apparatus can further include circuitry coupled to the first secondary coil and the second secondary coil. The circuitry can be configured to receive the first voltage from the first secondary coil and the second voltage from the second secondary coil. The circuitry can also be configured to determine a feedback voltage based on a difference between the first voltage and the second voltage. The feedback voltage can correct the difference. The circuitry can also modify a third voltage that can be output by the circuitry to be zero based on the feedback voltage. The circuitry can further provide the third voltage.

One or more embodiments of the subject matter described herein can be provided. For example, the apparatus can be an alternating magnetic current sensor. The circuitry can also include a summer that can receive the first voltage, the second voltage, and the feedback voltage and can output the third voltage. The circuitry can further include an AC/DC converter that can receive the third voltage as an AC feedback signal and can output a DC feedback signal. The circuitry can also include an amplifier that can receive the DC feedback signal and can output an amplified DC signal. The circuitry can further include a filter that can receive the amplified DC signal and can output a filtered signal. The circuitry can also include a multiplier that can receive the second voltage and the filtered signal and can output the feedback voltage.

The primary coil can be coupled to a voltage source and the AC/DC converter can be demodulated with respect to a voltage provided by the voltage source. The feedback voltage can be determined to balance the first voltage and the second voltage. The feedback voltage can be determined to cancel a phase difference between the first voltage and the second voltage. Determining the feedback voltage to cancel the phase difference can include measuring the phase difference and determining an amplitude and a phase of the feedback voltage.

The circuitry can be configured in executable, computer-readable instructions or on physical hardware. The circuitry can further include a balancing coil coupled to the primary coil and the feedback voltage can be provided to the balancing coil. The feedback voltage can include a variable amplitude of a fixed phase. The feedback voltage can include a variable frequency, variable amplitude, and variable phase determined using discrete Fourier transforms or fast Fourier transforms.

In another aspect, an apparatus is provided. In an embodiment, the apparatus can include a first primary coil that can output a first magnetic field and a second primary coil that can output a second magnetic field. The apparatus can also include a first secondary coil and circuitry coupled to the first secondary coil and to the second primary coil. The circuitry can be configured to receive, via the first secondary coil, the first magnetic field from the first primary coil and the second magnetic field from the second primary coil. The circuitry can also be configured to determine a feedback voltage based on a difference between the first magnetic field and the second magnetic field. The feedback voltage can correct the difference. The circuitry can further be configured to modify a third voltage output by the circuitry to be zero based on the feedback voltage. The circuitry can also be configured to provide the third voltage.

One or more embodiments of the subject matter described herein can be provided. For example, the circuitry can include a difference amplifier that can be coupled to the first secondary coil. The circuitry can also include an AC/DC converter that can receive the DC feedback signal and can output an amplified DC signal. The circuitry can further include a filter that can receive the amplified DC signal and can output a filtered signal. The circuitry can also include a summer that can receive the filtered signal and a trim value and can output an excitation signal. The circuitry can further include a multiplier that can receive an input voltage from a voltage source and the excitation signal and can output the feedback voltage.

The feedback voltage can be determined to balance the second magnetic field. The circuitry can be configured in executable, computer-readable instructions or on physical hardware. The feedback voltage can include a variable amplitude of a fixed phase. The feedback voltage can include a variable amplitude and a variable phase during using I and Q demodulation. The feedback voltage can include a variable frequency, variable amplitude, and variable phase determined using discrete Fourier transforms or fast Fourier transforms.

DESCRIPTION OF DRAWINGS

These and other features will be more readily understood from the following detailed description taken in conjunction with the accompanying drawings, in which.

Figure 1:
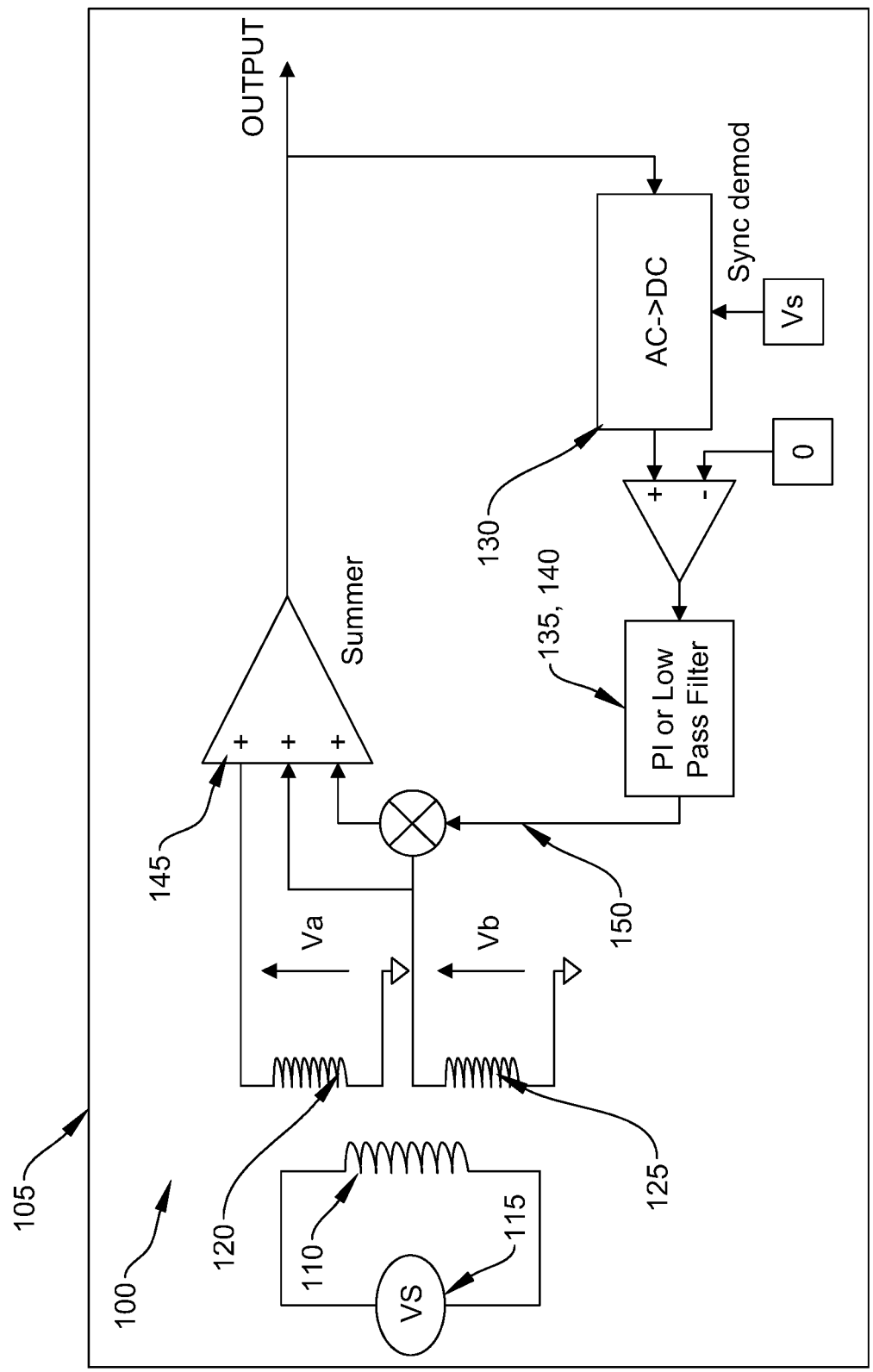
FIG. 1 illustrates an exemplary embodiment of a magnetic sensor circuit configured to correct non-zero output signals in null conditions.

It is noted that the drawings are not necessarily to scale. The drawings are intended to depict only typical aspects of the subject matter disclosed herein, and therefore should not be considered as limiting the scope of the disclosure.

DETAILED DESCRIPTION

Magnetic sensors can use two coils connected in antiphase to generate a null or zero voltage under balance conditions. When a magnetic and/or conductive material is introduced in proximity of the two coils, a non-null voltage can be generated by the sensor. In this way, the sensor can detect motion or presence of the magnetic and/or the conductive material.

Occasionally, the magnetic sensor may cease to output zero in the null state. For example, manufacturing tolerances, environmental effects, and/or installation issues can cause the sensor to no longer achieve a null state and to drift over time. If the voltage output by the sensor in the null state becomes significantly deviated from a nominal null state voltage value, e.g., zero, such as when the null state voltage is significantly larger than the signal voltage value measured by the sensor, the sensor may not operate properly and may limit amplification, resolution, and sensitivity of the sensor. For example, when it is desired to utilize the sensor in high resolution and sensitivity applications, it can be advantageous to amplify the sensor voltage to enhance observability of the measured signal. However, manufacturing tolerances, environmental effects, and/or installation issues can cause the sensor to have a significant, non-zero output in the null state. In some cases, the non-zero output can be many times the size of the signal being sought using the sensor.

Mechanical or physical adjustment of the sensor can be applied to correct non-null sensor outputs in null states. However, such methods can alter the precision and stability of the sensor in undesirable ways. Further, physical adjustment requires the sensor to be removed from operation for correction of the non-null signal output in null conditions.

Embodiments of the sensor, circuitry, and methods of operation described herein can correct non-null sensor output signals without introducing sensor downtime, added costs, and/or reliability issues. The sensor and circuitry described herein utilize a closed loop approach for measuring the signal in null states and its deviation from a nominal zero value to determine a feedback signal used to balance or otherwise adjust the sensor output in null states to be zero. This can allow the sensor to periodically adjust the null state output signal every hour, day, or week for example to correct output signal drift resulting from extended use, manufacturing defects, and/or installation issues.

In dynamic applications, such as vibration, particle counting, or object detection, the null value sensor output signal can be dynamically adjusted at a rate that is independent of fast signal variations which may actually be occurring in observed signal generated by the sensor. In this way, the sensor and circuitry can provided closed loop control of the sensor null values in real time.

The sensor and circuitry described herein can provide a fixed phase balancing signal as feedback to the electrical or magnetic circuit. The amplitude of the feedback signal can be adjusted as need to rebalance the coils of the sensor and to generate a null state output signal that more closely approximates or achieves a zero value. In addition, the sensor and circuitry described herein can cancel out of phase null voltages to generate true zero voltage conditions. Such cancelation operations are not possible with mechanical or scalar adjustment methods.

FIG. 1 illustrates an exemplary embodiment of a circuitry 100 configured within or coupled to a sensor 105 described herein to correct non-zero output signals in null conditions. The primary coil 110 can be coupled to a voltage source 115 (VS) and can be in proximity of a first secondary coil 120 and a second secondary coil 125. Nominal output of the two secondary coils is usually zero when the first secondary coil 120 and the second secondary coil 125 produce zero net voltage. Effectively, Va will equal −Vb. The circuitry 100 coupled to the first secondary coil 120 and the second secondary coil 125 can sense unbalanced voltage outputs and can generate a feedback voltage 150 to modify the voltage (Vb) output by the second secondary coil 125. The circuitry 100 can include an AC/DC converter 130 configured to demodulate the AC output signal from the sensor circuitry 100 with regard to the voltage Vs supplied by the voltage source 115 to a baseband direct current (DC) signal. The circuitry 100 can further generate an error from a desired baseline "0". In some embodiments, the circuitry 100 can include a proportional and integral (PI) terms 135 which can be fed back to the sensor to force a null condition. When PI terms 135 are fed back to the sensor the sensor output can become differential and can respond to rapid changes advantageously over slow changes. In some embodiments, the circuitry can include a low pass filter 140 to exclude fast signal variations and to drive a scalar multiplier so as to adjust a balancing term. The balancing term can have a fixed phase, such as a fixed phase matching Vb, and can thus null inphase phases without altering quadrature.

Figure 2:
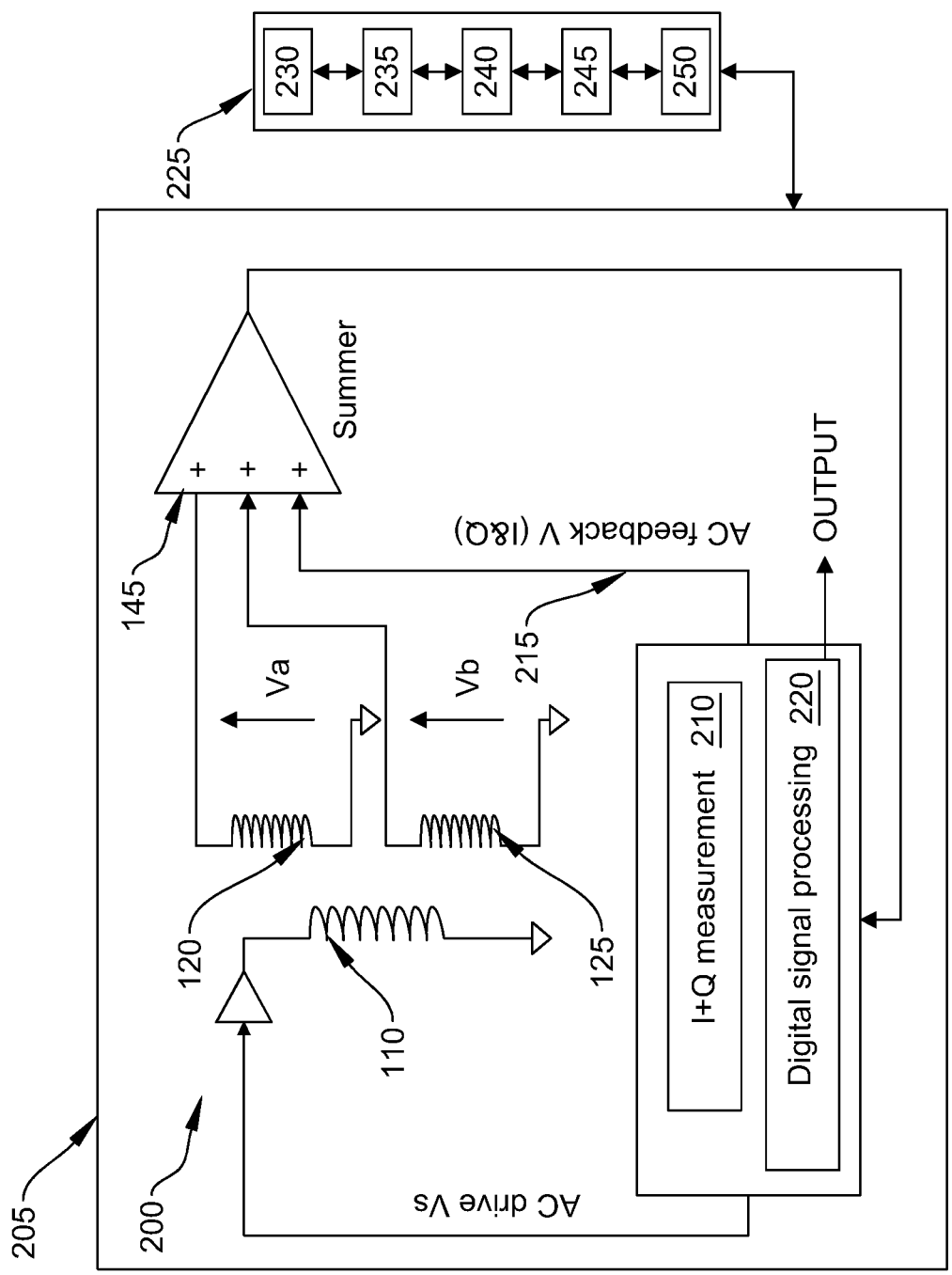
FIG. 2 illustrates another exemplary embodiment of a magnetic sensor circuit configured to correct non-zero output signals in null conditions via signal cancellation.

FIG. 2 illustrates another exemplary embodiment of a circuit 200 configured within or coupled to a sensor 205 described herein to correct non-zero output signals in null conditions via signal cancellation. As shown in FIG. 2, the circuitry 200 can be configured in a similar manner as circuit 100 of FIG. 1 and can be further configured to use digital signal processing (DSP) techniques to perform inphase (I) and quadrature (Q) measurements. For example, the circuitry 200 of the embodiment shown in FIG. 2, can measure unbalanced voltages and can determine an amplitude and phase of a feedback signal in order to cancel the non-null voltage magnitude. In this way, the non-null voltage output can be modified to a null or zero value when the phase shift is not insignificant. In some embodiments, the circuitry 200 can include analog components 210 to measure I and Q in place of using DSP techniques. In some embodiments, the feedback voltage 215 can include a variable amplitude of a fixed phase. In these embodiments, the feedback voltage 215 can be created from the null voltage measured across the AC/DC converter shown in FIG. 1. In some embodiments, the feedback voltage 215 can include a variable amplitude and a variable phase. In these embodiments, the feedback voltage 215 can be determined using I and Q demodulation as shown in FIG. 2. In some embodiments, the feedback voltage 215 can include a variable frequency, a variable amplitude, and a variable phase. In these embodiments, the feedback voltage 215 can be determined using discrete Fourier transforms (DFT) or fast Fourier transforms (FFT) using digital signal processing components 220.

As further shown in FIG. 2, the sensor 205 can be coupled to a computing device 225. The computing device 225 can include a processor 230, and a memory 235 storing executable, computer-readable instructions. The instructions when executed by the processor 230 can control or operate aspects of the sensor 205, such as adjusting parameter values, trim values, or the like necessary to control or operate the feedback mechanism implemented by the circuitry 200. The computing device 225 can also include a communication interface 240 to enable wireless or wired communication and data exchange with the sensor 205. The computing device 225 can also include a display 245 to provide visual data generated by the sensor 205. The computing device 225 can also include an input device 250 at which a user can interact with the computing device 225.

Figure 3:
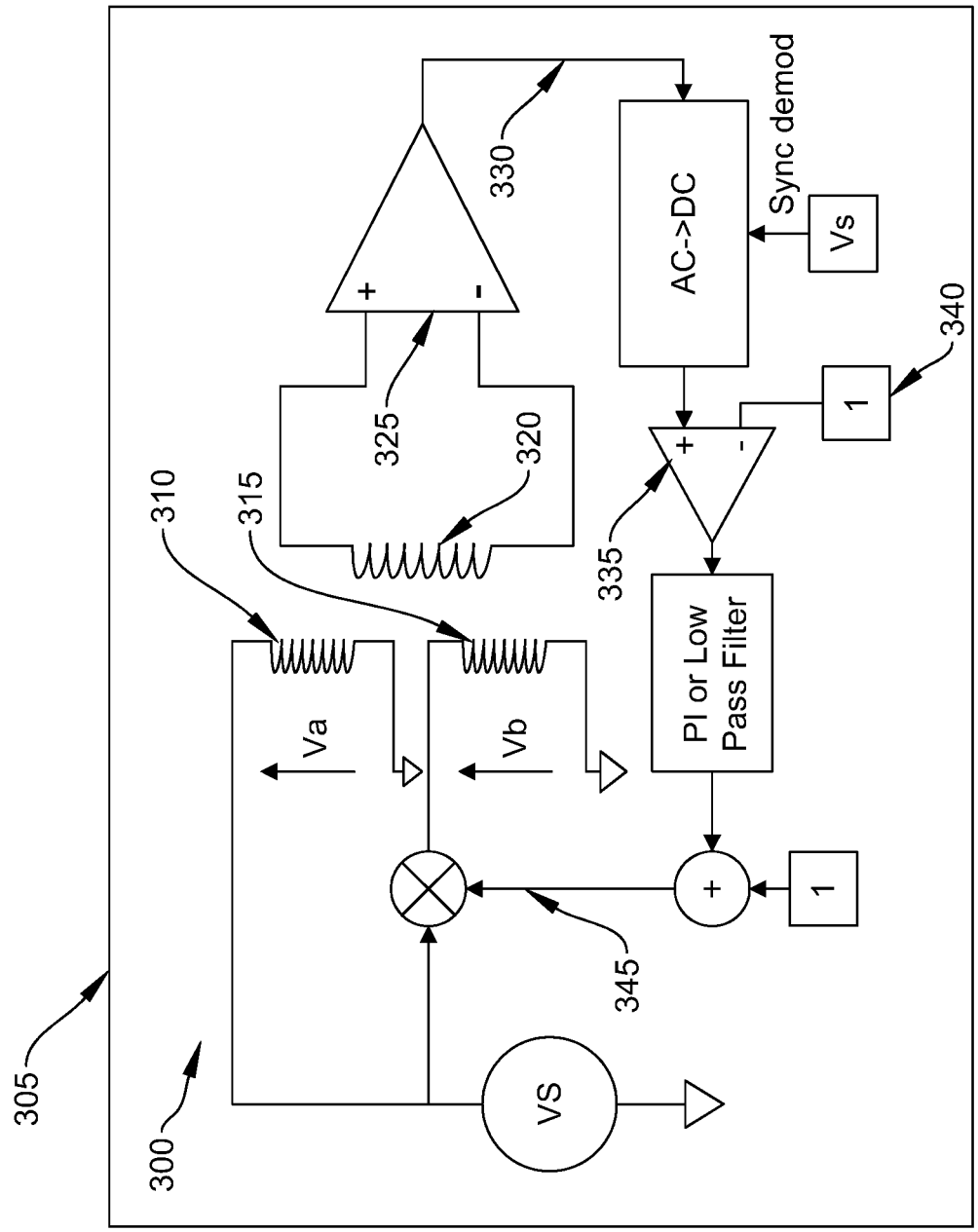
FIG. 3 illustrates another exemplary embodiment of a magnetic sensor circuit configured to correct non-zero output signals in null conditions via magnetic rebalancing.

FIG. 3 illustrates another exemplary embodiment of a circuit 300 configured within or coupled to a sensor 305 configured to correct non-zero output signals in null conditions via magnetic rebalancing. As shown in FIG. 3, portions of the circuitry 300 can be configured in a similar manner as circuit 100 of FIG. 1. In FIGS. 1 and 2, the circuitry 100, 200 is configured to achieve nulling by modifying the secondary voltages Va and Vb output by the first secondary coil 120 and the second secondary coil 125 respectively on the electrical side of the magnetic sensor. In contrast, the circuitry 300 shown in FIG. 3 includes two antiphase driven primary coils 310 and 315 each producing a magnetic field, such as a first magnetic field Va and a second magnetic field Vb. This arrangement can also considered a split primary coil. In this arrangement, the first magnetic field Va and the second magnetic field Vb can generate a net null magnetic field sensed by a single secondary coil 320. The single secondary coil 320 can be coupled to a difference amplifier 325. This configuration can be useful in determining a change in position of the secondary coil 320 or the position of a core material positioned between the two primary coils 310, 315 and the secondary coil 320.

The sensor 305 will produce a nominal output of zero voltage when the first primary coil 310 and the second primary coil 315 produce zero net magnetic field, for example when Va is equal to −Vb. The difference amplifier 325 can sense the unbalanced voltage output and can provide a feedback signal 330 causing excitation. For example, the PI terms can be output to a summer 335, which can further receive a trim value 340 as an input, such as a "1", to correct the arithmetic processing at the multiplier associated with Vb. In this way, the circuitry 300 can maintain Vb equal to Va, or in other terms, Vb=Va*(1+PI). In some embodiments, the circuitry 300 can be configured using digital signal processing techniques or computational blocks. In some embodiments, the circuitry 300 can be configured on physical hardware, such as an FPGA.

Figure 4:
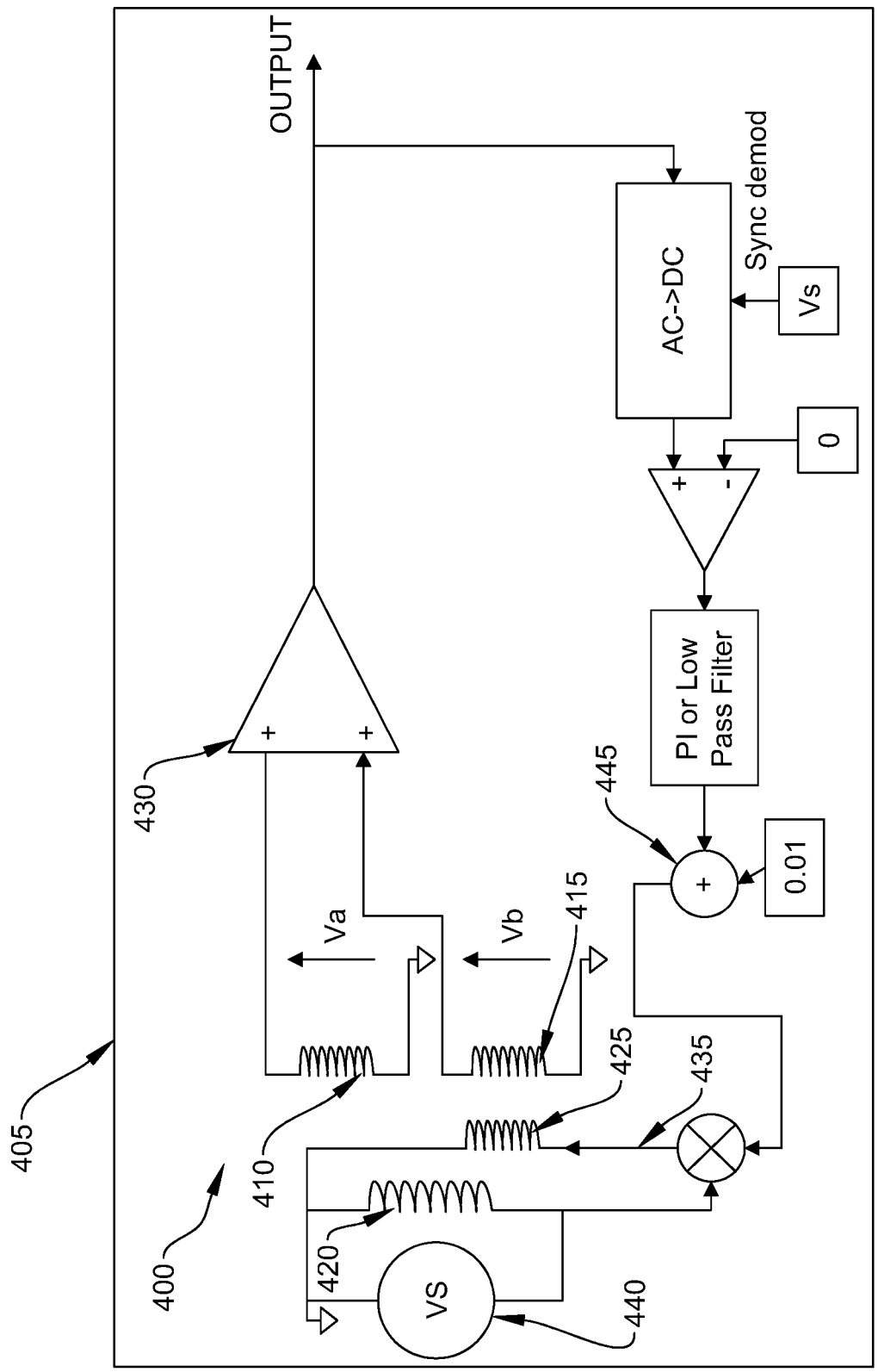
FIG. 4 illustrates an exemplary embodiment of a magnetic sensor circuit configured to correct non-zero output signals in null conditions via magnetic cancellation.

FIG. 4 illustrates an exemplary embodiment of a circuit 400 configured within or coupled to a sensor 405 to correct non-zero output signals in null conditions via magnetic cancellation. As shown in FIG. 4, portions of the circuitry 400 can be configured in a similar manner as circuit 100 of FIG. 1. As shown in the embodiment of FIG. 4, the sensor circuit 400 can include a first secondary coil 410 and a second secondary coil 415, a first primary coil 420, and a null correction coil 425 configured in an asymmetric location relative to the first secondary coil 410 and the second secondary coil 415. Excitation of the null correction coil 425 can create a positive or negative change in balance, depending on the AC polarity.

For example, as shown in FIG. 4, a summer 430 can be used to sum the magnetic fields Va and Vb. In some embodiments, the summer 430 can be a passive summer. In some embodiments, the summer 430 can be an active summer. The circuitry 400 can sense the unbalanced magnetic field and can provide a feedback voltage 435 on the magnetic side of the magnetic sensor 405 to a balancing coil 425 configured in relation to the primary coil 420 and the voltage source (VS) 440. For example, the circuitry 400 can be configured to generate a feedback voltage 435 nominally within 1% of excitation. A trim value, such as +/−1% trim in excitation, can be provided based on an expected level of imbalance to be corrected being less than 1%. The 1% trim value input was provided assuming the multiplier 445 is configured as a 2 quadrant configuration (i.e., 0 to 1%) and incapable of negative multiplication. Thus, the circuitry 400 can be deliberatively offset by 0.5% and the resulting correction would always be positive, for example, 1%-PI. In some embodiments, the trim can be removed and the multiplier 445 can be configured as a 4 quadrant configuration.

In some embodiments, the circuitry 400 can be configured using digital signal processing techniques or computational blocks. In some embodiments, the circuitry can be configured on physical hardware, such as an FPGA.

Embodiments of the sensor circuitry described herein can be configured to provide the feedback voltage 150 as scalar feedback terms, as shown in FIG. 1. In this way, the feedback voltage 150 can be determined as a basic multiplication operation of the error term. As shown in FIG. 2, the phase sensitive measurement of the I and Q components can enable the feedback voltage 215 to be a complex value of a particular amplitude and phase in order to ensure a near perfect null. In some embodiments, the sensor circuitry described herein can measure harmonics in the signal and determine the associated correction in real time. For example, discrete Fourier transforms (DFT) or fast Fourier transforms (FFT) may be utilized to receive harmonic signal perturbations. In some embodiments, the choice of scalar, vector (I, Q), or spectral null corrections can be used independent of the arrangement and numbers of primary and secondary coils configured in the sensor.

In some embodiments, the circuitry described herein can include analog components to measure I and Q in place of using DSP techniques. In some embodiments, the feedback voltage can include a variable amplitude of a fixed phase. In these embodiments, the feedback voltage can be created from the null voltage measured across the AC/DC converter as shown in feedback voltage 345 and 435 respectively shown in FIGS. 3 and 4. In some embodiments, the feedback voltage can include a variable amplitude and a variable phase. In these embodiments, the feedback voltage can be determined using I and Q demodulation. In some embodiments, the feedback voltage can include a variable frequency, a variable amplitude, and a variable phase. In these embodiments, the feedback voltage can be determined using discrete Fourier transforms (DFT) or fast Fourier transforms (FFT).

In one or more of the embodiments described herein output data, such as voltages can be provided by the circuitry. In some embodiments, the voltages can be provided to a computing device that can be coupled to the sensors described herein as shown and described in relation to FIG. 2.

Certain exemplary embodiments have been described to provide an overall understanding of the principles of the structure, function, manufacture, and use of the systems, devices, and methods disclosed herein. One or more examples of these embodiments have been illustrated in the accompanying drawings. Those skilled in the art will understand that the systems, devices, and methods specifically described herein and illustrated in the accompanying drawings are non-limiting exemplary embodiments and that the scope of the present invention is defined solely by the claims. The features illustrated or described in connection with one exemplary embodiment can be combined with the features of other embodiments. Such modifications and variations are intended to be included within the scope of the present invention. Further, in the present disclosure, like-named components of the embodiments generally have similar features, and thus within a particular embodiment each feature of each like-named component is not necessarily fully elaborated upon.

The subject matter described herein can be implemented in analog electronic circuitry, digital electronic circuitry, and/or in computer software, firmware, or hardware, including the structural means disclosed in this specification and structural equivalents thereof, or in combinations of them. The subject matter described herein can be implemented as one or more computer program products, such as one or more computer programs tangibly embodied in an information carrier (e.g., in a machine-readable storage device), or embodied in a propagated signal, for execution by, or to control the operation of, data processing apparatus (e.g., a programmable processor, a computer, or multiple computers). A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub-programs, or portions of code). A computer program can be deployed to be executed on one computer or on multiple computers at one site or distributed across multiple sites and interconnected by a communication network.

The processes and logic flows described in this specification, including the method steps of the subject matter described herein, can be performed by one or more programmable processors executing one or more computer programs to perform functions of the subject matter described herein by operating on input data and generating output. The processes and logic flows can also be performed by, and apparatus of the subject matter described herein can be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processor of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, (e.g., EPROM, EEPROM, and flash memory devices); magnetic disks, (e.g., internal hard disks or removable disks); magneto-optical disks; and optical disks (e.g., CD and DVD disks). The processor and the memory can be supplemented by, or incorporated in, special purpose logic circuitry.

To provide for interaction with a user, the subject matter described herein can be implemented on a computer having a display device, e.g., a CRT (cathode ray tube) or LCD (liquid crystal display) monitor, for displaying information to the user and a keyboard and a pointing device, (e.g., a mouse or a trackball), by which the user can provide input to the computer. Other kinds of devices can be used to provide for interaction with a user as well. For example, feedback provided to the user can be any form of sensory feedback, (e.g., visual feedback, auditory feedback, or tactile feedback), and input from the user can be received in any form, including acoustic, speech, or tactile input.

The techniques described herein can be implemented using one or more modules. As used herein, the term "module" refers to computing software, firmware, hardware, and/or various combinations thereof. At a minimum, however, modules are not to be interpreted as software that is not implemented on hardware, firmware, or recorded on a non-transitory processor readable recordable storage medium (i.e., modules are not software per se). Indeed "module" is to be interpreted to always include at least some physical, non-transitory hardware such as a part of a processor or computer. Two different modules can share the same physical hardware (e.g., two different modules can use the same processor and network interface). The modules described herein can be combined, integrated, separated, and/or duplicated to support various applications. Also, a function described herein as being performed at a particular module can be performed at one or more other modules and/or by one or more other devices instead of or in addition to the function performed at the particular module. Further, the modules can be implemented across multiple devices and/or other components local or remote to one another. Additionally, the modules can be moved from one device and added to another device, and/or can be included in both devices.

The subject matter described herein can be implemented in a computing system that includes a back-end component (e.g., a data server), a middleware component (e.g., an application server), or a front-end component (e.g., a client computer having a graphical user interface or a web browser through which a user can interact with an implementation of the subject matter described herein), or any combination of such back-end, middleware, and front-end components. The components of the system can be interconnected by any form or medium of digital data communication, e.g., a communication network. Examples of communication networks include a local area network ("LAN") and a wide area network ("WAN"), e.g., the Internet.

Approximating language, as used herein throughout the specification and claims, can be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language can correspond to the precision of an instrument for measuring the value. Here and throughout the specification and claims, range limitations can be combined and/or interchanged, such ranges are identified and include all the sub-ranges contained therein unless context or language indicates otherwise.

One skilled in the art will appreciate further features and advantages of the invention based on the above-described embodiments. Accordingly, the present application is not to be limited by what has been particularly shown and described, except as indicated by the appended claims. All publications and references cited herein are expressly incorporated by reference in their entirety.

The invention claimed is:

1. An apparatus comprising:
   a primary coil;
   a first secondary coil outputting a first voltage;
   a second secondary coil outputting a second voltage; and
   circuitry coupled to the first secondary coil and the second secondary coil, the circuitry configured to
   receive the first voltage from the first secondary coil and the second voltage from the second secondary coil,
   determine a feedback voltage based on a difference between the first voltage and the second voltage, the feedback voltage correcting the difference,
   modify a third voltage output by the circuitry to be zero based on the feedback voltage, and
   provide the third voltage.

2. The apparatus of claim 1, wherein the apparatus is an alternating current magnetic sensor.

3. The apparatus of claim 1, wherein the circuitry includes
   a summer receiving the first voltage, the second voltage, and the feedback voltage and outputting the third voltage,
   an AC/DC converter receiving the third voltage as an AC feedback signal and outputting a DC feedback signal,
   an amplifier receiving the DC feedback signal and outputting an amplified DC signal,
   a filter receiving the amplified DC signal and outputting a filtered signal, and
   a multiplier receiving the second voltage and the filtered signal and outputting the feedback voltage.

4. The apparatus of claim 3, wherein the primary coil is coupled to a voltage source and the AC/DC converter is demodulated with respect to a voltage provided by the voltage source.

5. The apparatus of claim 1, wherein the feedback voltage is determined to balance the first voltage and the second voltage.

6. The apparatus of claim 1, wherein the feedback voltage is determined to cancel a phase difference between the first voltage and the second voltage.

7. The apparatus of claim 6, wherein determining the feedback voltage to cancel the phase difference includes measuring the phase difference and determining an amplitude and a phase of the feedback voltage.

8. The apparatus of claim 1, wherein the circuitry is configured in executable, computer-readable instructions or on physical hardware.

9. The apparatus of claim 1, wherein the circuitry further includes a balancing coil coupled to the primary coil and the feedback voltage is provided to the balancing coil.

10. The apparatus of claim 1, wherein the feedback voltage includes a variable amplitude of a fixed phase.

11. The apparatus of claim 1, wherein the feedback voltage includes a variable amplitude and a variable phase determined using I and Q demodulation.

12. The apparatus of claim 1, wherein the feedback voltage includes a variable frequency, variable amplitude, and variable phase determined using discrete Fourier transforms or fast Fourier transforms.

13. An apparatus comprising:
   a first primary coil outputting a first magnetic field;
   a second primary coil outputting a second magnetic field;
   a first secondary coil; and
   circuitry coupled to the first secondary coil and to the second primary coil, the circuitry configured to
   receive, via the first secondary coil, the first magnetic field from the first primary coil and the second magnetic field from the second primary coil,
   determine a feedback voltage based on a difference between the first magnetic field and the second magnetic field, the feedback voltage correcting the difference,
   modify a third voltage output by the circuitry to be zero based on the feedback voltage, and
   provide the third voltage.

14. The apparatus of claim 13, wherein the circuitry includes
   a difference amplifier coupled to the first secondary coil,
   an AC/DC converter receiving an AC output of the difference amplifier and outputting a DC feedback signal,
   an amplifier receiving the DC feedback signal and outputting an amplified DC signal,
   a filter receiving the amplified DC signal and outputting a filtered signal,
   a summer receiving the filtered signal and a trim value and outputting an excitation signal, and
   a multiplier receiving an input voltage from a voltage source and the excitation signal and outputting the feedback voltage.

15. The apparatus of claim 13, wherein the feedback voltage is determined to balance the second magnetic field.

16. The apparatus of claim 13, wherein the circuitry is configured in executable, computer-readable instructions or on physical hardware.

17. The apparatus of claim 13, wherein the feedback voltage includes a variable amplitude of a fixed phase.

18. The apparatus of claim 13, wherein the feedback voltage includes a variable amplitude and a variable phase determined using I and Q demodulation.

19. The apparatus of claim 13, wherein the feedback voltage includes a variable frequency, variable amplitude, and variable phase determined using discrete Fourier transforms or fast Fourier transforms.

* * * * *